United States Patent
Wang

(10) Patent No.: US 10,359,460 B2
(45) Date of Patent: Jul. 23, 2019

(54) ESD DETECTION APPARATUS AND METHOD APPLIED TO DIGITAL INTEGRATED CIRCUIT, AND INTEGRATED CIRCUIT

(71) Applicant: SHENZHEN GOODIX TECHNOLOGY CO., LTD., Shenzhen (CN)

(72) Inventor: Guangyao Wang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 146 days.

(21) Appl. No.: 15/700,141

(22) Filed: Sep. 10, 2017

(65) Prior Publication Data

US 2018/0017606 A1 Jan. 18, 2018

Related U.S. Application Data

(63) Continuation of application No. PCT/CN2016/089755, filed on Jul. 12, 2016.

(51) Int. Cl.
*G01R 31/00* (2006.01)
*G06F 17/18* (2006.01)
(Continued)

(52) U.S. Cl.
CPC ........... *G01R 31/002* (2013.01); *G06F 17/18* (2013.01); *G11C 29/785* (2013.01); *G11C 2029/5002* (2013.01)

(58) Field of Classification Search
CPC .................................................. G01R 29/12
See application file for complete search history.

(56) References Cited

U.S. PATENT DOCUMENTS 5,006,787 A 4/1991 Katircioglu et al.
6,092,027 A 7/2000 Takai et al.
(Continued)

FOREIGN PATENT DOCUMENTS

CN 101288215 A 10/2008
CN 101373199 A 2/2009
(Continued)

OTHER PUBLICATIONS

Jerry Twomey, "Protect Your Fortress From ESD", Electronic Design http://www.electronicdesign.com/print/51969, Aug. 9, 2012, 5 pages.

*Primary Examiner* — Clayton E. LaBalle
*Assistant Examiner* — Jas A Sanghera

(57) ABSTRACT

Disclosed are an ESD detection apparatus and method applied to digital integrated circuit, and an integrated circuit. The apparatus includes: a check read control module, configured to initiate a read operation for a flip-flop set module; and a check calculation module, configured to receive a data value sent by the flip-flop set module according to the read operation, perform check calculation according to the data value, and determine, according to comparison of a result of the check calculation and a history check calculation result, whether an ESD overrun is present. According to the present application, a simple circuit structure is employed to detect the ESC overrun, without occupying resources of an external main controller. As such, other operations may not be affected, the efficiency is improved, and the ESD overrun may be detected in real time.

20 Claims, 5 Drawing Sheets

(51) Int. Cl.
    *G11C 29/00*    (2006.01)
    *G11C 29/50*    (2006.01)

(56) References Cited

U.S. PATENT DOCUMENTS

| | | | |
|---|---|---|---|
| 8,730,624 | B2 | 5/2014 | Chang et al. |
| 9,379,540 | B2 | 6/2016 | Xiao |
| 2008/0001965 | A1* | 1/2008 | Kang .................... H03M 13/43 |
| | | | 345/605 |
| 2010/0201899 | A1* | 8/2010 | Yamamoto .............. G09G 3/36 |
| | | | 349/40 |
| 2012/0278027 | A1 | 11/2012 | Jindal et al. |
| 2015/0215477 | A1 | 7/2015 | Kim et al. |
| 2016/0140377 | A1 | 5/2016 | Zhong et al. |

FOREIGN PATENT DOCUMENTS

| | | | |
|---|---|---|---|
| CN | 101610080 | A | 12/2009 |
| CN | 101626228 | A | 1/2010 |
| CN | 101938118 | A | 1/2011 |
| CN | 102368171 | A | 3/2012 |
| CN | 104810813 | A | 7/2015 |
| CN | 104836565 | A | 8/2015 |
| CN | 105281312 | A | 1/2016 |
| JP | 2001344992 | A | 12/2001 |
| JP | 2003032229 | A | 1/2003 |

* cited by examiner

ESD DETECTION APPARATUS AND METHOD APPLIED TO DIGITAL INTEGRATED CIRCUIT, AND INTEGRATED CIRCUIT

CROSS REFERENCE TO RELATED APPLICATIONS

The present application is a continuation of international application No. PCT/CN2016/089755, filed on Jul. 12, 2016, which is hereby incorporated by reference in its entirety.

TECHNICAL FIELD

The present application relates to the technical field of ESD detection, and in particular, relates to an ESD detection apparatus and method applied to a digital integrated circuit, and an integrated circuit.

BACKGROUND

Electro-static discharge (ESD) is always an important factor to be considered in design of integrated circuits. An integrated circuit has an upper limit on a tolerant voltage of the ESD. For example, 10 KV indicates that the integrated circuit may tolerate an ESD voltage in the range of −10 KV to +10 KV. If the ESD voltage exceeds this range, an ESD overrun is present. The ESD overrun may probably result in temporary or permanent damages of components in the integrated circuit.

With respect to a digital circuit, an ESD overrun may probably result in a value hop of a trigger of the basic storage unit in the digital circuit, from "0" to "1" or from "1" to "0". As a result, circuit calculations related to this trigger encounter errors, and thus the entire circuit is subject to a functionality error. During operation of the circuit, once an ESD overrun is present, operation of the circuit may be subject to errors. If no detection and recovery measures are taken, the circuit may operate in the error state for a long time, which finally causes the integrated circuit to malfunction.

Generally, the ESD detection method is passive, and state of the conventional circuit is detected by using an external main controller. Once it is detected that the circuit state does not comply with expectation, it is considered that an ESD overrun is present, and then the circuit is reset. However, this manner may occupy resources of the external main controller, affect other operations, and have a low efficiency, which fails to detect an ESD overrun in real time.

Therefore, an ESD active detection apparatus is urgently desired to solve the problem in the related art.

SUMMARY

In view of the above problem, the present application provides an ESD detection apparatus, an integrated circuit and an ESD detection method to solve or partially solve the above problem.

One aspect of the present application provides an ESD detection apparatus applied to a digital integrated circuit. The ESD detection apparatus includes:

a check read control module, configured to initiate a read operation for a flip-flop set module;

a check calculation module, configured to receive a data value sent by the flip-flop set module according to the read operation, perform check calculation according to the data value, and determine, according to comparison of a result of the check calculation and a history check calculation result, whether an ESD overrun is present.

Another aspect of the present application provides a digital integrated circuit having an ESD detection function, the digital integrated circuit includes:

a flip-flop set module, configured to send, according to an ESD read operation, a data value corresponding to the ESD read operation;

an ESD detection module, configured to send the ESD read operation to the flip-flop set module, perform check calculation according to the received data value, and determine, according to comparison of a result of the check calculation and a history check calculation result, whether to send an ESD overrun signal; and an interrupt generation module, configured to generate an interrupt signal according to the received ESD overrun signal and send the interrupt signal to an external main controller, such that the external main controller is reset.

Still another aspect of the present application provides an ESD detection method applied to a digital integrated circuit. The ESD detection method includes:

initiating a read operation for a flip-flop set module; and receiving all data values sent by the flip-flop set module according to the read operation, performing check calculation according to the data values, and determining, according to comparison of a result of the check calculation and a history check calculation result, whether an ESD overrun is present.

Still another aspect of the present application provides an ESD detection method applied to a digital integrated circuit. The ESD detection method includes:

sending, according to an ESD read operation, a data value corresponding to the ESD read operation;

performing check calculation according to the received data value, and determining, according to comparison of a result of the check calculation and a history check calculation result, whether to send an ESD overrun signal; and generating an interrupt signal according to the received ESD overrun signal and sending the interrupt signal to an external main controller, such that the external main controller is reset.

In the ESD detection apparatus and method applied to a digital integrated circuit, and the integrated circuit according to the present application, check calculation is performed for data values sent by the flip-flop set module by using the check read control module and the check calculation module, and whether an ESD overrun is present is determined according to comparison of a result of the check calculation and a history check calculation result. Therefore, according to the present application, a simple circuit structure is employed to detect the ESD overrun, without occupying resources of an external main controller. As such, other operations may not be affected, the efficiency is improved, and the ESD overrun may be detected in real time.

The above description only summarizes the technical solutions of the present application. Specific embodiments of the present application are described hereinafter to better and clearer understand the technical solutions of the present application, to practice the technical solutions based on the disclosure of the specification and to make the above and other objectives, features and advantages of the present application more apparent and understandable.

BRIEF DESCRIPTION OF THE DRAWINGS

By reading the detailed description of preferred embodiments hereinafter, various other advantages and beneficial effects become clear and apparent for persons of ordinary skill in the art. The accompanying drawings are merely for illustrating the preferred embodiments, but shall not be construed as limiting the present application. In all the accompanying drawings, like reference signs denote like parts. In the drawings.

DETAILED DESCRIPTION

Some exemplary embodiments of the present application are hereinafter described in detail with reference to the accompanying drawings. Although the accompanying drawings illustrate the exemplary embodiments of the present application, it shall be understood that the present application may be practiced in various manners, and the present application shall not be limited by the embodiments illustrated herein. On the contrary, these embodiments are described herein only for the purpose of better understanding the present application, and may integrally convey the scope of the present application to a person skilled in the art.

Figure 1:
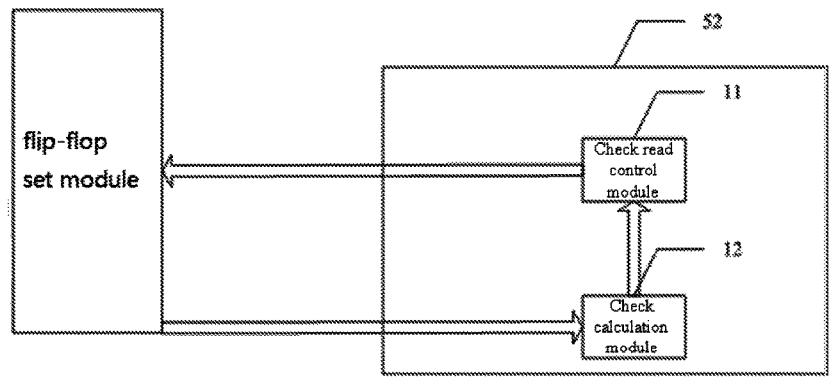
FIG. 1 is a schematic diagram of an ESD detection apparatus applied to a digital integrated circuit according to one embodiment of the present application.

Referring to FIG. 1, one embodiment of the present application provides an ESD detection apparatus applied to a digital integrated circuit. The ESD detection apparatus includes:

a check read control module 11, configured to initiate a read operation for a flip-flop set module (register file module);

a check calculation module 12, configured to receive a data value (value of the flip-flop set module, or a trigger value) sent by the flip-flop set module according to the read operation, perform check calculation according to the data value, and determine, according to comparison of a result of the check calculation and a history check calculation result, whether an ESD overrun is present.

The check calculation typically includes parity check, sum check, and cyclic redundancy check (CRC). The CRC is a discrete function of generating fixed-bit check code according to a network data packet or a computer file and the like data. The CRC can be used to detect or check possible errors upon data transmission or storage. The generated bits are calculated before transmission or storage and then appended to the data, and then a receiver performs a check to determine whether the data is changed. Since this function is simple to implement in binary computer hardware, easy to analyze mathematically, and particularly good at detecting data errors, this embodiment specifically employs the CRC calculation.

Specifically, the check read control module 11 is configured as a CRC read control module, and is configured to initiate the read operation to the flip-flop set module via a register control bus; and the flip-flop set module is configured to send the data values to the check calculation module 12 via a register read bus upon receiving the read operation.

The flip-flop set module may include all the flip-flops, or may include only some of the flip-flops. The number of the flip-flops should be sufficient to determine whether an ESD overrun is present in the entire digital circuit. The data values may be read values of all the flip-flops of the flip-flop set module, or may be a part of read values of all the flip-flops of the flip-flop set module. However, no matter in which case, the data values should be sufficient to determine whether an ESD overrun is present in the entire digital circuit.

The check calculation module 12 is configured to perform CRC calculation according to the data values, and determine, according to comparison of the current CRC calculation result and a history CRC calculation result, whether the ESD overrun is present.

The history CRC calculation result is generally a result of a previous CRC calculation.

Therefore, according to the present application, a simple circuit structure is employed to detect the ESC overrun, without occupying resources of an external main controller. As such, other operations may not be affected, the efficiency may be improved, and the ESD overrun may be detected in real time.

Figure 2:
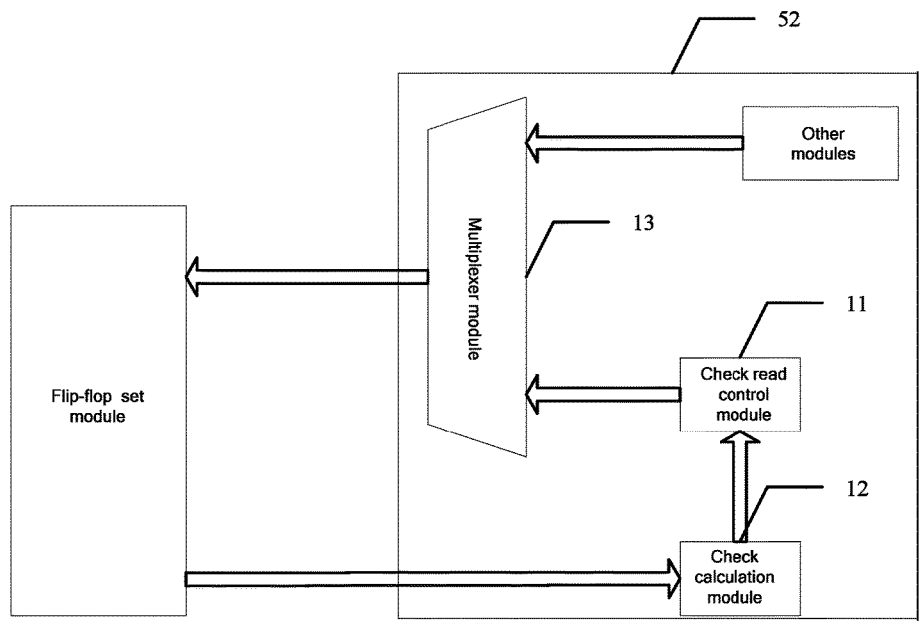
FIG. 2 is a schematic diagram of an ESD detection apparatus applied to a digital integrated circuit according to another embodiment of the present application.

Another embodiment of the present application provides another ESD detection apparatus applied to a digital integrated circuit. Referring to FIG. 2, the ESD detection apparatus includes a check read control module 11 and a check calculation module 12, and further includes:

a multiplexer module 13, configured to: when other modules perform a write operation, send the write operation of other modules to the flip-flop set module, and otherwise, send the read operation from the check read control module 11 to the flip-flop set module.

The other modules include any module that is capable of performing a write operation for the flip-flop set module, for example, an MCU module.

The multiplexer module 13 is configured to select an operation from a register write bus of the other modules or a register read bus of the check read control module, and output the selected operation. The register write bus of other modules has no write operation, an operation from the register read bus of the check read control module is selected and output, and a group of read operations from the check read control module 11 are output to the flip-flop set module.

Therefore, in this embodiment, when the other modules have no write operation, the read operation from the check read control module 11 may be sent to the flip-flop set module through the multiplexer module 13, and other operations of the other modules are not affected while the ESD detection is performed for the flip-flop set module.

Figure 3:
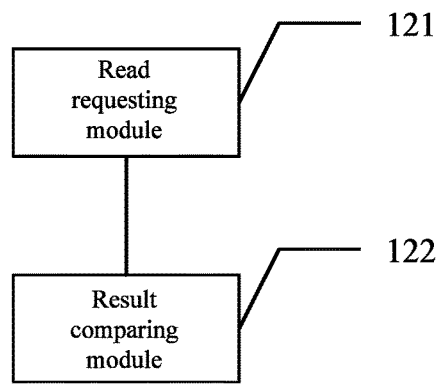
FIG. 3 is a schematic diagram of a check calculation module in an ESD detection apparatus applied to a digital integrated circuit according to one embodiment of the present application.

Still another embodiment of the present application provides another ESD detection apparatus applied to a digital integrated circuit. Referring to FIG. 3, the check calculation module 12 includes:

a read requesting module 121, configured to, upon receiving a group of data values according to an algorithm bit width, send a request signal of a next group of data to the check read control module until calculation of all the data values is complete.

Specifically, an algorithm bit width of check calculation of the check calculation module 12 is determined according to the specific application, and if the algorithm bit width for check calculation is N, the check calculation module 12 may calculate N-bit data for one time.

The algorithm bit width for check calculation is adjusted according to the number of flip-flops in the flip-flop set module, such that the algorithm bit width of check calculation of the check calculation module 12 according to the number of flip-flops desiring ESD detection, thereby implementing more flexible ESD detection.

Upon completion of calculation of the N-bit data, the check calculation module 12 sends a next data request signal to the check read control module 11 for requesting a next group of N-bit data. Afterwards, the check read control module 11 sends the read data to the check calculation module 12, and sequentially cyclically performs such operation until all the data values are sent to the check calculation module 12 and the calculation is complete.

a result comparing module 122, configured to compare the result of the check calculation of all the data values and the history check calculation result to determine whether the ESD overrun is present.

Specifically, the result comparing module 122 is specifically configured to determine that the ESD overrun is not present if the result of the check calculation of the data value is equal to the history check calculation result, and otherwise, determine that the ESD overrun is present.

Therefore, in this embodiment, values of the flip-flops are batchwise read by the read requesting module 121 according to the algorithm bit width of check calculation, such that check calculation of the data values is complete. Such implementation is more flexible. In this embodiment, the current check calculation result is compared with a history calculation result by the result comparing module 122 to determine whether the ESD overrun is present. The algorithm is simple, the ESD detection efficiency is high, and real-time ESD detection may be implemented.

Figure 4:
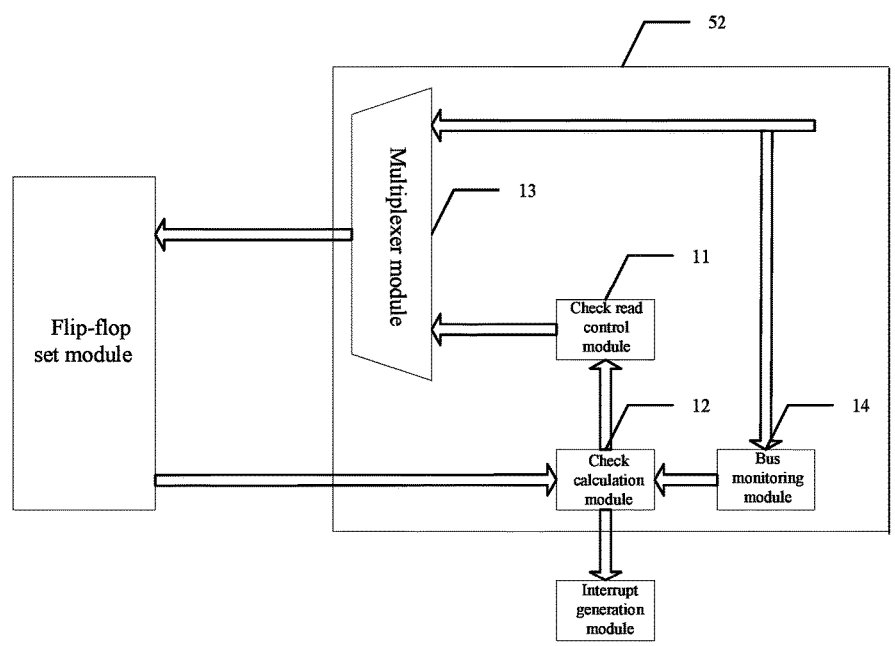
FIG. 4 is a schematic diagram of an ESD detection apparatus applied to a digital integrated circuit according to still another embodiment of the present application.

Still another embodiment of the present application provides another ESD detection apparatus applied to a digital integrated circuit. Referring to FIG. 4, the ESD detection apparatus further includes:

a bus monitoring module 14, configured to set a bus flag signal to a first value if other modules perform a write operation, and otherwise, set the bus flag signal to a second value.

Specifically, the first value is 1, and the second value is 0.

The check calculation module 12 is further configured to determine that the ESD overrun is present if the bus flag signal is set to the second value and the result of the check calculation of all the data values is not equal to the history check calculation result.

Specifically, the bus monitoring module 14 is configured to monitor a register write bus from other modules, set a bus flag signal to 1 if detecting that the register write bus from the other modules has a write operation, and set the bus flag signal to 0 upon completion of the check calculation. It is determined that the ESD overrun is present if the bus flag signal is set to 0 and the result of the check calculation of all the data values is not equal to the history check calculation result.

Figure 5:
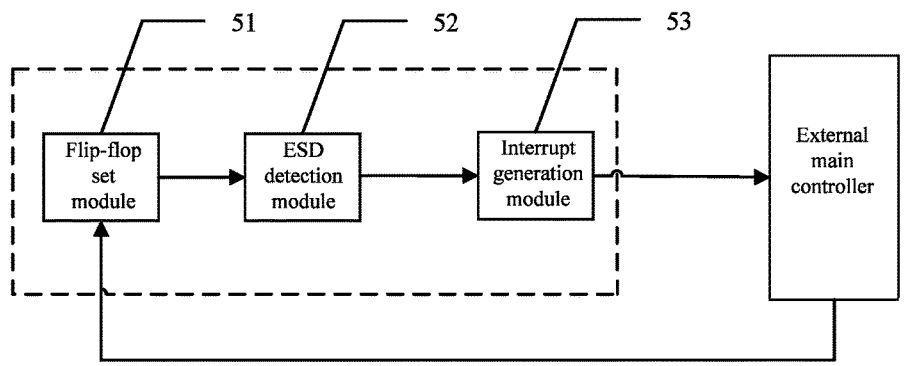
FIG. 5 is a schematic diagram of a digital integrated circuit having an ESD detection function according to one embodiment of the present application.

Referring to FIG. 5, one embodiment of the present application provides a digital integrated circuit having an ESD detection function. The digital integrated circuit includes:

a flip-flop set module 51, configured to send, according to an ESD read operation, all data values corresponding to the ESD read operation;

an ESD detection module 52, configured to send the ESD read operation to the flip-flop set module, perform check calculation according to all the received data values, and determine, according to comparison of a result of the check calculation and a history check calculation result, whether to send an ESD overrun signal; and an interrupt generation module 53, configured to generate an interrupt signal according to the received ESD overrun signal and send the interrupt signal to an external main controller, such that the external main controller is reset.

In this embodiment, ESD detection is performed by the ESD detection module 52 for the flip-flop set module 51, and the interrupt signal is generated according to an ESD overrun signal detected by the ESD detection module 52 and the generated interrupt signal is sent to the external main controller, such that the external main controller is reset. Therefore, according to the present application, a simple circuit structure is employed to detect the ESD overrun, without occupying resources of an external main controller. As such, other operations may not be affected, the efficiency is improved, and the ESD overrun may be detected in real time.

In a specific implementation of the present application, referring to FIG. 1, the ESD detection module 52 includes:

a check read control module 11, configured to initiate a read operation for a flip-flop set module;

a check calculation module 12, configured to receive all data values sent by the flip-flop set module according to the read operation, perform check calculation according to the data values, and determine, according to comparison of a result of the check calculation and a history check calculation result, whether an ESD overrun is present.

The check calculation typically includes parity check, sum check, and cyclic redundancy check (CRC). The CRC is a discrete function of generating fixed-bit check code according to a network data packet or a computer file and the like data. The CRC is used to detect or check possible errors upon data transmission or storage. The generated bits are calculated before transmission or storage and then appended to the data, and then a receiver performs a check to determine whether the data is changed. Since this function is simple to implement in binary computer hardware easy to analyze mathematically, and particularly good at detecting common errors, this embodiment specifically employs the CRC calculation.

Specifically, the check read control module 11 is configured to a CRC read control module, and is configured to initiate the read operation to the flip-flop set module via a register read bus of the check calculation; and the flip-flop set module is configured to send the data values to the check calculation module 12 via a register read bus upon receiving the read operation.

The check calculation module 12 is configured to perform CRC calculation according to the data values, and determine, according to comparison of the current CRC calculation result and a history CRC calculation result, whether the ESD overrun is present.

The history CRC calculation result is generally a result of a previous CRC calculation.

In another specific implementation of the present application, referring to FIG. 2, the ESD detection module 52 includes: a check read control module 11 and a check calculation module 12, and further includes:

a multiplexer module 13, configured to: when other modules perform a write operation, send the write operation of other modules to the flip-flop set module, and otherwise, send the read operation from the check read control module 11 to the flip-flop set module.

The multiplexer module 13 is configured to select an operation from a register write bus of the other modules or a register read bus of the check read control module, and output the selected operation. The register write bus of other modules has no write operation, an operation from the register read bus of the check read control module is selected and output, and a group of read operations from the check read control module 11 are output to the flip-flop set module.

Therefore, in this embodiment, when the other modules have no write operation, the read operation from the check read control module 11 may be sent to the flip-flop set module through the multiplexer module 13, and other operations of the other modules are not affected while the ESD detection is performed for the flip-flop set module.

In another specific implementation of the present application, referring to FIG. 3, the check calculation module 12 includes:

a read requesting module 121, configured to, upon receiving a group of data values according to an algorithm bit width, send a request signal of a next group of data to the check read control module until calculation of the data values is complete;

Specifically, an algorithm bit width of check calculation of the check calculation module 12 is determined according to the specific application, and if the algorithm bit width for check calculation is N, the check calculation module 12 may calculate N-bit data for one time.

The algorithm bit width for check calculation is adjusted according to the number of flip-flops in the flip-flop set module, such that the algorithm bit width of check calculation of the check calculation module 12 is adjusted according to the number of flip-flops desiring ESD detection, thereby implementing more flexible ESD detection.

Upon completion of calculation of the N-bit data, the check calculation module 12 sends a next data request signal to the check read control module 11 for requesting a next group of N-bit data. Afterwards, the check read control module 11 sends the read data to the check calculation module 12, and sequentially cyclically performs such operation until all the data values are sent to the check calculation module 12 and the calculation is complete.

a result comparing module 122, configured to compare the result of the check calculation of the data value and the history check calculation result to determine whether the ESD overrun is present.

Specifically, the result comparing module 122 is specifically configured to determine that the ESD overrun is not present if the result of the check calculation of the data value is equal to the history check calculation result, and otherwise, determine that the ESD overrun is present.

Therefore, in this embodiment, values of the flip-flops are batchwise read through the read requesting module 121 according to the algorithm bit width of check calculation, such that check calculation of the data value is complete. Such implementation is more flexible. In this embodiment, the current check calculation result is compared with a history calculation result by the result comparing module 122 to determine whether the ESD overrun is present. The algorithm is simple, the ESD detection efficiency is high, and real-time ESD detection may be implemented.

In another specific implementation of the present application, referring to FIG. 4, the ESD detection module 52 further includes:

a bus monitoring module 14, configured to set a bus flag signal to a first value if other modules perform a write operation, and otherwise, set the bus flag signal to a second value.

Specifically, the first value is 1, and the second value is 0.

The check calculation module 12 is further configured to determine that the ESD overrun is present if the bus flag signal is set to the second value and the result of the check calculation of the data value is not equal to the history check calculation result.

Specifically, the bus monitoring module 14 is configured to monitor a register write bus from other modules, set a bus flag signal to 1 if detecting that the register write bus from the other modules has a write operation, and set the bus flag signal to 0 upon completion of the check calculation. It is determined that the ESD overrun is present if the bus flag signal is set to 0 and the result of the check calculation of the data value is not equal to the history check calculation result.

Figure 6:
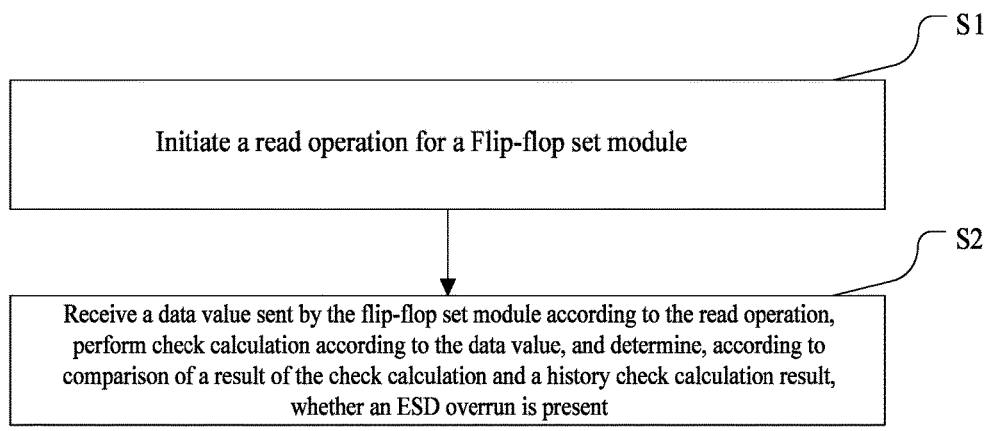
FIG. 6 is a flowchart of an ESD detection method applied to a digital integrated circuit according to one embodiment of the present application.

Referring to FIG. 6, one embodiment of the present application provides an ESD detection method applied to a digital integrated circuit. The ESD detection method includes:

S1: initiating a read operation for a flip-flop set module; and

S2: receiving a data value sent by the flip-flop set module according to the read operation, performing check calculation according to the data value, and determining, according to comparison of a result of the check calculation and a history check calculation result, whether an ESD overrun is present.

The check calculation typically includes parity check, sum check, and cyclic redundancy check (CRC). The CRC is a discrete function of generating fixed-bit check code according to a network data packet or a computer file and the like data. The CRC is used to detect or check possible errors upon data transmission or storage. The generated bits are calculated before transmission or storage and then appended to the data, and then a receiver performs a check to determine whether the data is changed. Since this function is simple to implement in binary computer hardware easy to analyze mathematically, and particularly good at detecting common errors, this embodiment specifically employs the CRC calculation.

Specifically, the read operation is initiated to the flip-flop set module via a register read bus of the CRC read control module, and upon receiving the read operation, the flip-flop set module sends the data values and performs check calculation for the data values via a register read bus.

The flip-flop set module may include all the flip-flops, or may include only a part of the flip-flops. The number of the part of the flip-flops should be sufficient to determine whether an ESD overrun is present in the entire digital circuit. The data values may be read values of all the flip-flops of the flip-flop set module, or may be a part of read values of all the flip-flops of the flip-flop set module. However, no matter in which of these two cases, the data values should be sufficient to determine whether an ESD overrun is present in the entire digital circuit.

CRC calculation is performed according to the data values, and whether the ESD overrun is present is determined according to comparison of the current CRC calculation result and a history CRC calculation result.

The history CRC calculation result is generally a result of a previous CRC calculation.

Therefore, according to the present application, a simple circuit structure is employed to detect the ESD overrun, without occupying resources of an external main controller. As such, other operations may not be affected, the efficiency is improved, and the ESD overrun may be detected in real time.

Figure 7:
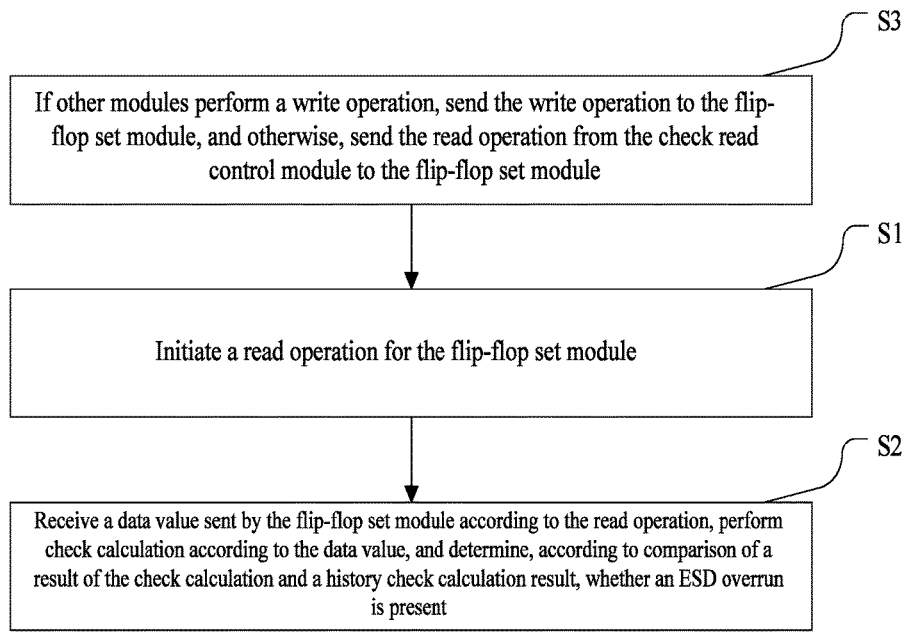
FIG. 7 is a flowchart of an ESD detection method applied to a digital integrated circuit according to another embodiment of the present application.

Another embodiment of the present application provides another ESD detection method applied to a digital integrated circuit. Referring to FIG. 7, the ESD detection method further includes:

S3: if other modules perform a write operation, sending the write operation of other modules to the flip-flop set module, and otherwise, sending the read operation from the check read control module to the flip-flop set module.

The other modules include any module that is capable of performing a write operation for the flip-flop set module, for example, an MCU module.

An operation from a register write bus of the other modules or a register read bus of the check read control module is selected, and then the selected operation is output. The register write bus of other modules has no write operation, an operation from the register read bus of the check read control module is selected and output, and a group of read operations are output to the flip-flop set module.

Therefore, in this embodiment, when the other modules have no write operation, the read operation from the check read control module may be sent to the flip-flop set module, and other operations of the other modules are not affected while the ESD detection is performed for the flip-flop set module.

Figure 8:
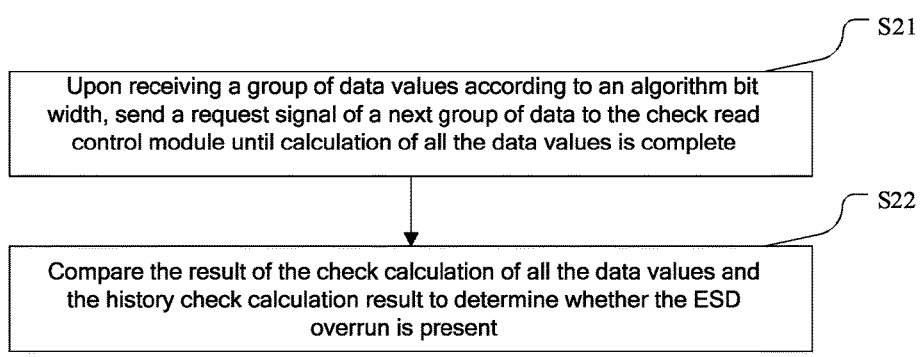
FIG. 8 is a flowchart of step S2 in an ESD detection method applied to a digital integrated circuit according to one embodiment of the present application.

Still another embodiment of the present application provides another ESD detection method applied to a digital integrated circuit. Referring to FIG. 8, the step S2 includes:

S21: upon receiving a group of data values according to an algorithm bit width, sending a request signal of a next group of data to the check read control module until calculation of all the data values is complete; and S22: comparing the result of the check calculation of all the data values and the history check calculation result to determine whether the ESD overrun is present.

The algorithm bit width for check calculation is adjusted according to the number of flip-flops in the flip-flop set module, such that the algorithm bit width of check calculation of the check calculation module 12 is adjusted according to the number of flip-flops desiring ESD detection, thereby implementing more flexible ESD detection.

Upon completion of calculation of the N-bit data, a next data request signal is sent to the check read control module for requesting a next group of N-bit data. Afterwards, the check read control module sends the read data for check calculation, such operation is sequentially cyclically performed until all the data values are calculated.

Specifically, step S22 specifically includes: determining that the ESD overrun is not present if the result of the check calculation of all the data value is equal to the history check calculation result, and otherwise, determining that the ESD overrun is present.

Therefore, in this embodiment, values of the flip-flops are batchwise read through the read requesting module 121 according to the algorithm bit width of check calculation, such that check calculation of the data value is complete. Such implementation is more flexible. In this embodiment, the current check calculation result is compared with a history calculation result by the result comparing module 122 to determine whether the ESD overrun is present. The algorithm is simple, the ESD detection efficiency is high, and real-time ESD detection may be implemented.

Figure 9:
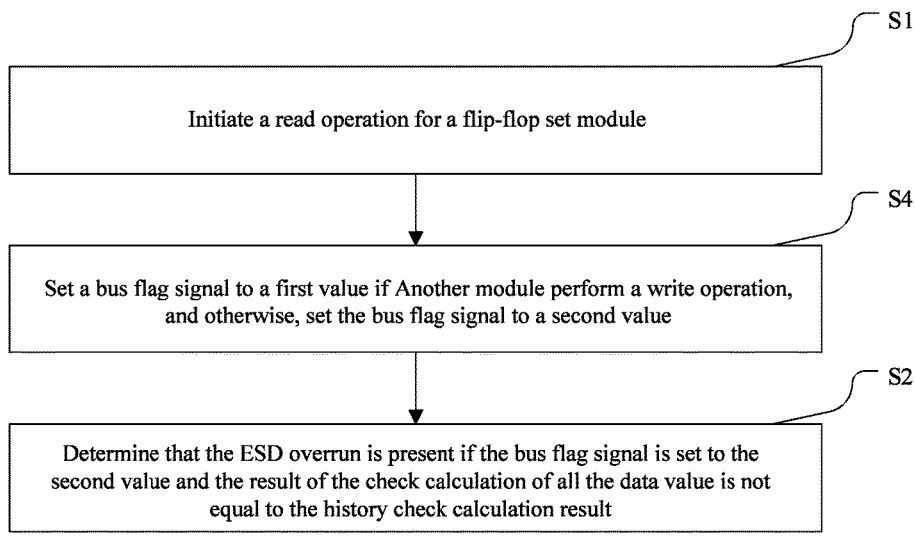
FIG. 9 is a schematic diagram of an ESD detection method applied to a digital integrated circuit according to still another embodiment of the present application.

Still another embodiment of the present application provides another ESD detection method applied to a digital integrated circuit. Referring to FIG. 9, the ESD detection method further includes:

S4: setting a bus flag signal to a first value if other modules perform a write operation, and otherwise, setting the bus flag signal to a second value.

Step S2 is specifically: determining that the ESD overrun is present if the bus flag signal is set to the second value and the result of the check calculation of all the data values is not equal to the history check calculation result.

Specifically, the first value is 1, and the second value is 0.

Specifically, a register write bus from other modules is monitored, a bus flag signal is set to 1 if it is detected that the register write bus from the other modules has a write operation, and the bus flag signal to is set 0 upon completion of the check calculation. It is determined that the ESD overrun is present if the bus flag signal is set to 0 and the result of the check calculation of all the data values is not equal to the history check calculation result.

Figure 10:
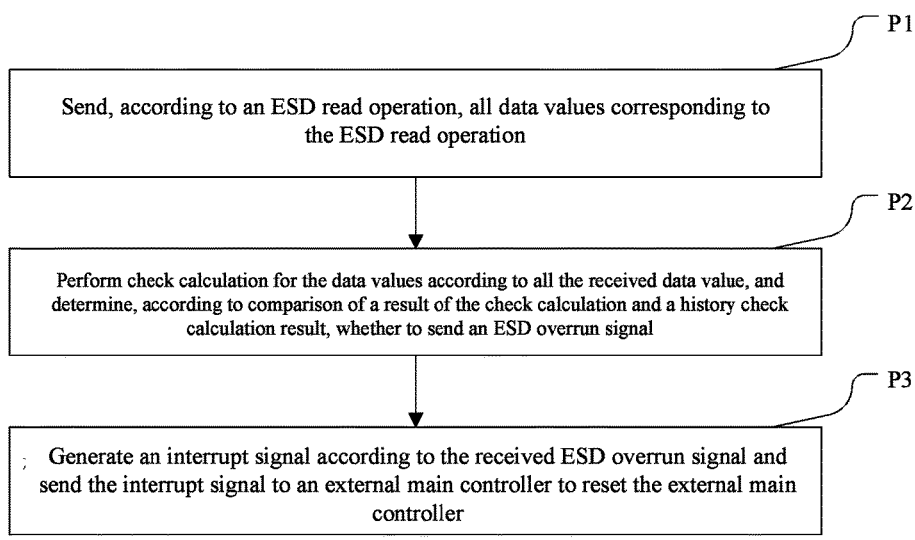
FIG. 10 is a flowchart of an ESD detection method applied to a digital integrated circuit according to one embodiment of the present application.

Referring to FIG. 10, one embodiment of the present application provides an ESD detection method applied to a digital integrated circuit. The ESD detection method includes:

P1: sending, according to an ESD read operation, all data values corresponding to the ESD read operation;

P2: performing check calculation for the data values according to all the received data values, and determining, according to comparison of a result of the check calculation and a history check calculation result, whether to send an ESD overrun signal; and P3: generating an interrupt signal according to the received ESD overrun signal and sending the interrupt signal to an external main controller, such that the external main controller is reset.

In this embodiment, ESD detection is performed for the flip-flop set module, and the interrupt signal is generated according to a detected ESD overrun signal and the generated interrupt signal is sent to the external main controller, such that the main controller is reset. Therefore, according to the present application, a simple circuit structure is employed to detect the ESD overrun, without occupying resources of an external main controller. As such, other operations may not be affected, the efficiency is improved, and the ESD overrun may be detected in real time.

In a specific implementation of the present application, referring to FIG. 6, step P2 includes:

S1: initiating a read operation for a flip-flop set module; and

S2: receiving all data values sent by the flip-flop set module according to the read operation, performing check calculation according to the data values, and determining, according to comparison of a result of the check calculation and a history check calculation result, whether an ESD overrun is present.

The check calculation typically includes parity check, sum check, and cyclic redundancy check (CRC). The CRC is a discrete function of generating fixed-bit check code according to a network data packet or a computer file and the like data. The CRC is used to detect or check possible errors upon data transmission or storage. The generated bits are calculated before transmission or storage and then appended to the data, and then a receiver performs a check to determine whether the data is changed. Since this function is simple to implement in binary computer hardware easy to analyze mathematically, and particularly good at detecting common errors, this embodiment specifically employs the CRC calculation.

Specifically, the read operation is initiated to the flip-flop set via a register read bus of the CRC read control module, and upon receiving the read operation, the flip-flop set module sends the data values and performs check calculation for the data values via a register read bus.

CRC calculation is performed according to the data values, and whether the ESD overrun is present is determined according to comparison of the current CRC calculation result and a history CRC calculation result.

The history CRC calculation result is generally a result of a previous CRC calculation.

Therefore, according to the present application, a simple circuit structure is employed to detect the ESC overrun, without occupying resources of an external main controller. As such, other operations may not be affected, the efficiency is improved, and the ESD overrun may be detected in real time.

Another embodiment of the present application provides another ESD detection method applied to a digital integrated circuit. Referring to FIG. 7, the ESD detection method further includes:

S3: if other modules perform a write operation, sending the write operation of other modules to the flip-flop set module, and otherwise, sending the read operation from the check read control module to the flip-flop set module.

An operation from a register write bus of the other modules or a register read bus of the check read control module is selected, and then the selected operation is output. The register write bus of other modules has no write operation, an operation from the register read bus of the check read control module is selected and output, and a group of read operations are output to the flip-flop set module.

Therefore, in this embodiment, when the other modules have no write operation, the read operation from the check read control module may be sent to the flip-flop set module, and other operations of the other modules are not affected while the ESD detection is performed for the flip-flop set module.

Still another embodiment of the present application provides another ESD detection method applied to a digital integrated circuit. Referring to FIG. 8, the step S2 includes:

S21: upon receiving a group of data values according to an algorithm bit width, sending a request signal of a next group of data to the check read control module until calculation of all the data values is complete; and S22: comparing the result of the check calculation of all the data values and the history check calculation result to determine whether the ESD overrun is present.

The algorithm bit width for check calculation is adjusted according to the number of flip-flops in the flip-flop set module, such that the algorithm bit width of check calculation of the check calculation module 12 according to the number of flip-flops desiring ESD detection, thereby implementing more flexible ESD detection.

Upon completion of calculation of the N-bit data, a next data request signal is sent to the check read control module for requesting a next group of N-bit data. Afterwards, the check read control module sends the read data for check calculation, such operation is sequentially cyclically performed until all the data values are calculated.

Specifically, step S22 specifically includes: determining that the ESD overrun is not present if the result of the check calculation of the data value is equal to the history check calculation result, and otherwise, determining that the ESD overrun is present.

Therefore, in this embodiment, values of the flip-flops are batchwise read through the read requesting module 121 according to the algorithm bit width of check calculation, such that check calculation of the data value is complete. Such implementation is more flexible. In this embodiment, the current check calculation result is compared with a history calculation result by the result comparing module 122 to determine whether the ESD overrun is present. The algorithm is simple, the ESD detection efficiency is high, and real-time ESD detection may be implemented.

Still another embodiment of the present application provides another ESD detection method applied to a digital integrated circuit. Referring to FIG. 9, the ESD detection method further includes:

S4: setting a bus flag signal to a first value if other modules perform a write operation, and otherwise, setting the bus flag signal to a second value.

Step S2 is specifically: determining that the ESD overrun is present if the bus flag signal is set to the second value and the result of the check calculation of all the data values is not equal to the history check calculation result.

Specifically, the first value is 1, and the second value is 0.

Specifically, a register write bus from other modules is monitored, a bus flag signal is set to 1 if it is detected that the register write bus from the other modules has a write operation, and the bus flag signal to is set 0 upon completion of the check calculation. It is determined that the ESD overrun is present if the bus flag signal is set to 0 and the result of the check calculation of all the data values is not equal to the history check calculation result.

The algorithms and displays provided herein are not inherently related to any specific computer, virtual system or other device. Various general-purpose systems may also be used with the teachings herein. According to the above description, the structure required for constructing such systems is obvious. In addition, the present application is not directed to any specific programming language. It should be understood that the content of the present application described herein may be carried out utilizing various programming languages, and that the above description for a specific language is for the sake of disclosing preferred embodiments of the present application.

In the specification provided herein, a plenty of particular details are described. However, it can be appreciated that an embodiment of the present application may also be practiced without these particular details. In some embodiments, well known methods, structures and technologies are not illustrated in detail so as not to obscure the understanding of the specification.

Likewise, it shall be understood that, to streamline the present application and facilitate understanding of one or more of various aspects of the present application, in the above description of the exemplary embodiments of the present application, various features of the present application are sometimes incorporated in an individual embodiment, drawing or description thereof. However, the method according to the present application shall not be explained to embody the following intension: the present application seeking protection claims more features than those explicitly disclosed in each of the appended claims. To be more exact, as embodied in the appended claims, the inventive aspects lie in that fewer features than all the features embodied in an individual embodiment as described above. Therefore, the claims observing the specific embodiments are herein incorporated into the specific embodiments, and each claim may be deemed as an individual embodiment of the present application.

Those skilled in the art should understand that modules in the devices according to the embodiments may be adaptively modified and these modules may be configured in one or more devices different from the embodiments herein. Modules or units or components in the embodiments may be combined into a single module or unit or component, and additionally these modules, units or components may be practiced in a plurality of sub-modules, subunits or subcomponents. Besides that, such features and/or processes or at least some of the units are mutually exclusive, all the features disclosed in this specification (including the appended claims, abstract and accompanying drawings) and all the processes or units in such disclosed methods or devices may be combined in any way. Unless otherwise stated, each of the features disclosed in this specification (including the appended claims, abstract and accompanying drawings) may be replaced by a provided same, equivalent or similar substitution.

In addition, those skilled in the art shall understand that, although some embodiments described herein include some features included in other embodiments, rather than other features, a combination of the features in different embodiments signifies that the features are within the scope of the present application and different embodiments may be derived. For example, in the claims appended hereinafter, any one of the embodiments seeking protection may be practiced in any combination manner.

Embodiments of the individual components of the present application may be implemented in hardware, or in a software module running one or more processors, or in a combination thereof. It will be appreciated by those skilled in the art that, in practice, some or all of the functions of some or all of the components in the message prompting apparatus according to individual embodiments of the present application may be implemented using a microprocessor or a digital signal processor (DSP). The present application may also be implemented as an apparatus of a device program (e.g., a computer program and a computer program product) for performing a part or all of the method as described herein. Such a program implementing the present application may be stored on a computer readable medium, or may be stored in the form of one or more signals. Such a signal may be obtained by downloading it from an Internet website, or provided on a carrier signal, or provided in any other form.

Reference herein to "one embodiment", "an embodiment" or to "one or more embodiments" implies that a particular feature, structure, or characteristic described in connection with the embodiments is included in at least one embodiment of the present application. Further, it should be noted that instances of the phrase "in one embodiment" herein are not necessarily all referring to the same embodiment.

In the specification provided herein, a plenty of particular details are described. However, it can be appreciated that an embodiment of the present application may also be practiced without these particular details. In some embodiments, well known methods, structures and technologies are not illustrated in detail so as not to obscure the understanding of the specification.

It should be noted that the above embodiments illustrate rather than limit the present application, and those skilled in the art may design alternative embodiments without departing from the scope of the appended claims. In the claims, any reference sign placed between the parentheses shall not be construed as a limitation to a claim. The word "comprise" does not exclude the presence of an element or a step not listed in a claim. The word "a" or "an" used before an element does not exclude the presence of a plurality of such elements. The present application may be implemented through a hardware comprising several distinct elements and through a suitably programmed computer. In a unit claim enumerating several devices, several of the devices may be embodied by one and the same hardware item. Use of the words "first", "second", "third" and the like does not mean any ordering. Such words may be construed as naming.

What is claimed is:

1. An electro-static discharge (ESD) detection apparatus applied to a digital integrated circuit, comprising:
    a check read control module, configured to initiate a read operation for a flip-flop set module; and
    a check calculation module, configured to receive a data value sent by the flip-flop set module according to the read operation, perform check calculation according to the data value, and determine, according to comparison of a result of the check calculation and a history check calculation result, whether an ESD overrun is present.

2. The ESD detection apparatus applied to a digital integrated circuit according to claim 1, wherein the check read control module is configured as a cyclic redundancy check (CRC) read control module, and the check calculation module is configured as a CRC calculation module.

3. The ESD detection apparatus applied to a digital integrated circuit according to claim 1, further comprising:
    a multiplexer module, configured to send a write operation of another module to the flip-flop set module, or send the read operation from the check read control module to the flip-flop set module when no write operation is performed.

4. The ESD detection apparatus applied to a digital integrated circuit according to claim 1, wherein the check calculation module comprises:
    a read requesting module, configured to, upon receiving a group of data values according to an algorithm bit width, send a request signal of a next group of data to the check read control module until calculation of the data values is complete; and
    a result comparing module, configured to compare the result of the check calculation and the history check calculation result to determine whether the ESD overrun is present.

5. The ESD detection apparatus applied to a digital integrated circuit according to claim 4, wherein the algorithm bit width of check calculation is adjusted according to the number of flip-flops in the flip-flop set module.

6. The ESD detection apparatus applied to a digital integrated circuit according to claim 4, wherein the result comparing module is configured to determine that the ESD overrun is not present if the result of the check calculation of the data value is equal to the history check calculation result.

7. The ESD detection apparatus applied to a digital integrated circuit according to claim 1, further comprising:
    a bus monitoring module, configured to set a bus flag signal to a first value if a write operation of another module is performed, or set the bus flag signal to a second value when no write operation is performed; and
    the check calculation module is further configured to determine that the ESD overrun is present if the bus flag signal is set to the second value and the result of the check calculation of the data value is not equal to the history check calculation result.

8. A digital integrated circuit having an electro-static discharge (ESD) detection function, comprising:
   a flip-flop set module, configured to send, according to an ESD read operation, a data value corresponding to the ESD read operation;
   an ESD detection module, configured to send the ESD read operation to the flip-flop set module, perform check calculation according to the received data value, and determine, according to comparison of a result of the check calculation and a history check calculation result, whether to send an ESD overrun signal; and
   an interrupt generation module, configured to generate an interrupt signal according to the received ESD overrun signal and send the interrupt signal to an external main controller to reset the external main controller.

9. The digital integrated circuit having an ESD detection function according to claim 8, wherein the ESD detection module comprises:
   a check read control module, configured to initiate a read operation for a flip-flop set module; and
   a check calculation module, configured to receive a data value sent by the flip-flop set module according to the read operation, perform check calculation according to the data value, and determine, according to comparison of a result of the check calculation and a history check calculation result, whether an ESD overrun is present.

10. The digital integrated circuit having an ESD detection function according to claim 9, wherein the check read control module is configured as a cyclic redundancy check (CRC) read control module, and the check calculation module is configured as a CRC calculation module.

11. The digital integrated circuit having an ESD detection function according to claim 9, further comprising:
   a multiplexer module, configured to send a write operation of another module to the flip-flop set module, or send the read operation from the check read control module to the flip-flop set module when no write operation is performed.

12. The digital integrated circuit having an ESD detection function according to claim 9, wherein the check calculation module comprises:
   a read requesting module, configured to, upon receiving a group of data values according to an algorithm bit width, send a request signal of a next group of data to the check read control module until calculation of the data values is complete; and
   a result comparing module, configured to compare the result of the check calculation of the data value and the history check calculation result to determine whether the ESD overrun is present.

13. The digital integrated circuit having an ESD detection function according to claim 12, wherein the result comparing module is configured to determine that the ESD overrun is not present if the result of the check calculation of the data value is equal to the history check calculation result.

14. The digital integrated circuit having an ESD detection function according to claim 9, further comprising:
   a bus monitoring module, configured to set a bus flag signal to a first value if a write operation is performed, or set the bus flag signal to a second value when no write operation is performed; and
   the check calculation module is further configured to determine that the ESD overrun is present if the bus flag signal is set to the second value and the result of the check calculation of the data value is not equal to the history check calculation result.

15. An electro-static discharge (ESD) detection method applied to a digital integrated circuit, comprising:
   sending, according to an ESD read operation, a data value corresponding to the ESD read operation;
   performing check calculation according to the received data value, and determining, according to comparison of a result of the check calculation and a history check calculation result, whether to send an ESD overrun signal; and
   generating an interrupt signal according to the received ESD overrun signal and sending the interrupt signal to an external main controller to reset the external main controller.

16. The ESD detection method applied to a digital integrated circuit according to claim 15, wherein the performing check calculation according to the received data value, and determining, according to comparison of a result of the check calculation and a history check calculation result, whether to send an ESD overrun signal comprises:
   initiating a read operation for a flip-flop set module; and
   receiving a data value sent by the flip-flop set module according to the read operation, performing check calculation according to the data value, and determining, according to comparison of a result of the check calculation and a history check calculation result, whether an ESD overrun is present.

17. The ESD detection method applied to a digital integrated circuit according to claim 16, wherein the check calculation employs cyclic redundancy check (CRC) calculation.

18. The ESD detection method applied to a digital integrated circuit according to claim 16, further comprising:
   if a write operation is performed by another module, sending the write operation to the flip-flop set module, or sending the read operation from the check read control module to the flip-flop set module if no write operation is performed.

19. The ESD detection method applied to a digital integrated circuit according to claim 16, the receiving a data value sent by the flip-flop set module according to the read operation, performing check calculation according to the data value, and determining, according to comparison of a result of the check calculation and a history check calculation result, whether an ESD overrun is present comprises:
   upon receiving a group of data values according to an algorithm bit width, sending a request signal of a next group of data to the check read control module until calculation of the data values is complete; and
   comparing the result of the check calculation of the data values and the history check calculation result to determine whether the ESD overrun is present.

20. The ESD detection method applied to a digital integrated circuit according to claim 19, wherein the comparing the result of the check calculation of the data values and the history check calculation result to determine whether the ESD overrun is present comprises: determining that the ESD overrun is not present if the result of the check calculation of the data value is equal to the history check calculation result, and determining that the ESD overrun is present if the result of the check calculation of the data value is not equal to the history check calculation result.

* * * * *